(12) United States Patent
Frost et al.

(10) Patent No.: US 6,581,186 B1
(45) Date of Patent: Jun. 17, 2003

(54) METHODS AND SYSTEMS FOR PROVIDING LOGIC CORES FROM THIRD PARTY LOGIC CORE PROVIDERS

(75) Inventors: Alan M. Frost, Centennial, WY (US); Smitha Sundaresan, Boulder, CO (US); James L. Burnham, Morgan Hill, CA (US)

(73) Assignee: Xilinx, Inc., San Jose, CA (US)

( * ) Notice: Subject to any disclaimer, the term of this patent is extended or adjusted under 35 U.S.C. 154(b) by 421 days.

(21) Appl. No.: 09/588,116

(22) Filed: May 31, 2000

(51) Int. Cl.⁷ .............................................. G06F 17/50
(52) U.S. Cl. ............................................ 716/1; 716/17
(58) Field of Search ........................ 716/1–21; 326/41, 326/38–39; 703/17, 14, 23

(56) References Cited

U.S. PATENT DOCUMENTS

| | | | | | |
|---|---|---|---|---|---|
| 5,754,173 A | * | 5/1998 | Hiura et al. | ................. | 345/744 |
| 6,064,382 A | * | 5/2000 | Diedrich et al. | ............. | 345/700 |
| 6,205,574 B1 | * | 3/2001 | Dellinger et al. | ........... | 340/14.3 |
| 6,216,259 B1 | * | 4/2001 | Guccione et al. | ............. | 716/17 |
| 6,247,166 B1 | * | 6/2001 | Aipperspach et al. | .......... | 716/1 |
| 6,272,451 B1 | * | 8/2001 | Mason et al. | ................. | 703/13 |
| 6,324,676 B1 | * | 11/2001 | Burnham et al. | ........... | 713/100 |
| 6,357,037 B1 | * | 3/2002 | Burnham et al. | .............. | 716/17 |
| 6,381,732 B1 | * | 4/2002 | Burnham et al. | ........... | 326/101 |
| 2001/0049593 A1 | * | 12/2001 | Mc Connell et al. | ......... | 703/14 |

* cited by examiner

Primary Examiner—Vuthe Siek
Assistant Examiner—Magid Y Dimyan
(74) Attorney, Agent, or Firm—Lance Sadler Lee & Hayes; Lois Cartier

(57) ABSTRACT

Methods and systems are provided in which logic cores from different third party core providers can be integrated for use with a single logic core generator. Core information from the various core providers is collected and formatted into a format that can be utilized by the single logic core generator. The information that is collected comprises at least one, and typically a number of different files. In some embodiments, the relevant core information is captured through the use of a graphical user interface (GUI) that guides particular core providers through a series of dialogs that capture the information. A formatting computer then takes the information and formats it into a form that can be utilized by the particular logic core generator. In the described embodiment, the information is formatted into at least one XCD file, which can then be utilized by the logic core generator. The newly-formatted cores can then be distributed to particular users for use with the core generator.

49 Claims, 10 Drawing Sheets

Core Capture Design Reuse Tool — 700

Company:
Address:
City:
State:
Zip:
Country:
Telephone:
FAX:
URL:
Email:
Support Phone:

< Back   >Next   Finish   Cancel

Core Capture Design Reuse Tool

Specify the output directory where these files have to be copied.

Output directory: —1102

Browse...

Library Name: —1104

Library Version: —1106

< Back    >Next    Finish    Cancel

METHODS AND SYSTEMS FOR PROVIDING LOGIC CORES FROM THIRD PARTY LOGIC CORE PROVIDERS

TECHNICAL FIELD

This invention relates to logic cores and, more particularly, to methods and systems for providing logic cores.

BACKGROUND OF THE INVENTION

System designers, e.g., circuit system designers, typically make use of a wide variety of software design tools to facilitate the design process. One particular type of design tool is a logic core generator. Logic core generators are essentially software tools that provide cataloging, customization, and delivery of so-called "cores". A "core" can be thought of as a design entity that is provided by a logic core generator for the system designer to use in the design process. A "core" typically includes a number of design files, a graphical user interface (GUI) that allows for customization of the core, simulation files, and symbol files for incorporation into third party CAE flows. Exemplary design entities include, without limitation, basic elements such as shift registers, decoders, and simple gates. Design entities can also include memories, processor products, processor peripherals, UARTs, and various DSP functions, to name just a few. Exemplary cores and design tools are available from Xilinx, Inc. of 2100 Logic Drive, San Jose, Calif. One commercially available logic core generator is the Xilinx CORE Generator™, which is described in detail in a document entitled "CORE Generator™ System 2.1i User Guide" that is available from Xilinx, or on-line at a web site having the URL: http://www.xilinx.com/products/logicore/coregen. This document is hereby incorporated herein by reference.

Typically, companies that offer core products and that design the products themselves provide software that enables customers to access and use the various cores. The customer typically provides a higher level design, and uses the various cores that are available to implement various functionalities that are needed in the design. There are many companies that provide cores for use in system design. Core generators, however, are not typically designed to natively enable the use of cores that are provided by different core providers. One reason is that core providers generally design their own cores in accordance with their own formats. If a particular format is not compatible with a core generator, then the core generator cannot natively use it to assist the system designer. Thus, when a system designer wishes to use such a core, he typically contacts the core provider, who then provides the core in whatever format is available. The burden is on the system designer to find a way to incorporate the third party core into his design.

Figure 1:
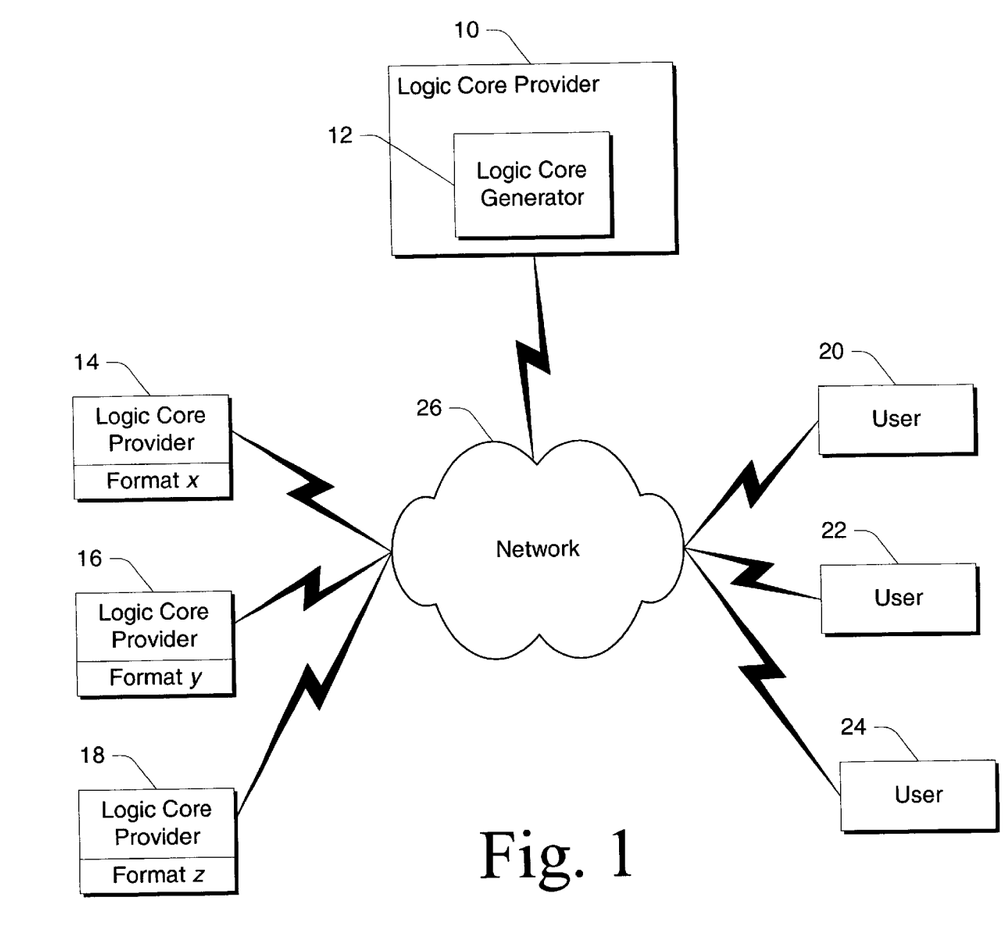
FIG. 1 is a diagram of an exemplary network environment that includes a plurality of logic core providers, a logic core generator, and a plurality of users.

This situation is diagrammatically shown in FIG. 1. In FIG. 1, a logic core provider 10 includes a core generator 12. In this example, logic core provider 10 provides various cores that assist system designers in designing their particular systems. Logic core generator 12 generates the cores that logic core provider 10 provides in well known ways. FIG. 1 also shows a number of different logic core providers 14, 16, and 18. Each of these logic core providers provides its own cores having its own respective format. For example, logic core provider 14 has cores that have a format x; logic core provider 16 has logic cores that have a format y; and logic core provider 18 has logic cores that have a format z. Each of these individual formats is incompatible with and cannot be used with the logic core generator 12 offered by logic core provider 10. Thus, when any of users 20, 22, and 24 desires to use a particular logic core that is offered by one of these other third party logic core providers, he must typically contact the individual logic core provider, e.g., via network 26, and have the logic core delivered in whatever format the particular logic core provider uses. Therefore, only logic cores in the same format can be combined.

Therefore, a given logic core provider may have a product containing many different cores that can be natively used by its core generator. The logic core provider may also maintain information about other cores that are provided by other third party core providers. When a system designer uses the core generator to build a system design, if he needs a core that is offered by a third party core provider, he typically cannot use the needed core in connection with the core generator he is currently using. This limitation is a problem because, as one might imagine, there may be a number of cores from different third party core providers that are desired to be incorporated into a design. Yet, without a way of standardizing the cores, combining the cores is extremely difficult, if not impossible.

Accordingly, the present invention arose out of concerns associated with providing methods and systems by which third party cores can be utilized by one or more core generators.

SUMMARY

Methods and systems of bundling third party logic cores are described. In one embodiment, a computer-implemented method provides logic cores for use with a logic core generator. The method comprises receiving, with a computer, information from one or more logic core providers. The information pertains to one or more logic cores that are available from the logic core providers. The information is in a format that cannot be used by the logic core generator. The information is processed with the computer to provide the information in a format that can be used by the logic core generator to generate logic cores.

In another embodiment, a computer-implemented method of providing logic cores for use with a logic core generator comprises defining a graphical user interface (GUI) that is configured to interface with third party logic core providers. The GUI collects information pertaining to one or more logic cores that are provided by the third party logic core providers. The collected information is then rendered into a form that is useable by the logic core generator for generating one or more logic cores.

In yet another embodiment, a logic core bundling wizard is provided and is configured for use in connection with a computer system having one or more processors. The logic core bundling wizard comprises a graphical user interface (GUI) that is executable on the one or more processors and configured to collect information from one or more third party logic core providers, so that the information can be processed into a form that is useable by a particular logic core generator.

In still a further embodiment, a logic core system comprises a logic core generator, multiple logic cores from a single logic core provider, and at least one logic core from at least one different logic core provider. All of the logic cores are preferably useable by the logic core generator to provide one or more logic cores.

In another embodiment, a computerized system that is configured to provide logic cores comprises a user display, one or more processors, memory, and software code in the memory. The software code, when executed by the processors, causes the processors to present a graphical user interface (GUI) on the user display through which a third party logic core provider can enter information about one or more of the logic cores that they provide. The information is automatically processed by the processors into a form that is useable by a particular logic core generator.

DETAILED DESCRIPTION OF THE DRAWINGS

Overview

In the described embodiments, methods and systems are provided in which logic cores from different third party core providers can be integrated for use with a single logic core generator. In the past, integration has been very difficult owing to the number and complexity of different core formats that are offered by different core providers. The inventive methods and systems present ways of capturing relevant core information from the various core providers, and formatting the information into a format that can be utilized by one particular logic core generator. Typically, the information collected from the core providers comprises at least one and usually a number of different files. In some embodiments of the invention, the relevant core information is captured through the use of an inventive graphical user interface (GUI) that guides particular core providers through a series of dialogs that capture the information. A formatting computer then takes the information and formats it into a form that can be utilized by the particular logic core generator. In the described embodiment, the information is formatted into at least one XCD file that can then be utilized by the logic core generator. The newly-formatted cores can then be distributed to particular users for use with the core generator.

In a described embodiment, the methods and systems are intended for use with so-called fixed logic cores. Fixed logic cores are cores having parameters that cannot be manipulated by a user. It is to be understood, however, that the inventive techniques can be easily extended to non-fixed logic cores, i.e., parameterizable logic cores in which the user can manipulate certain parameters of the logic cores.

Exemplary System for Providing Logic Cores from Multiple Providers

Figure 2:
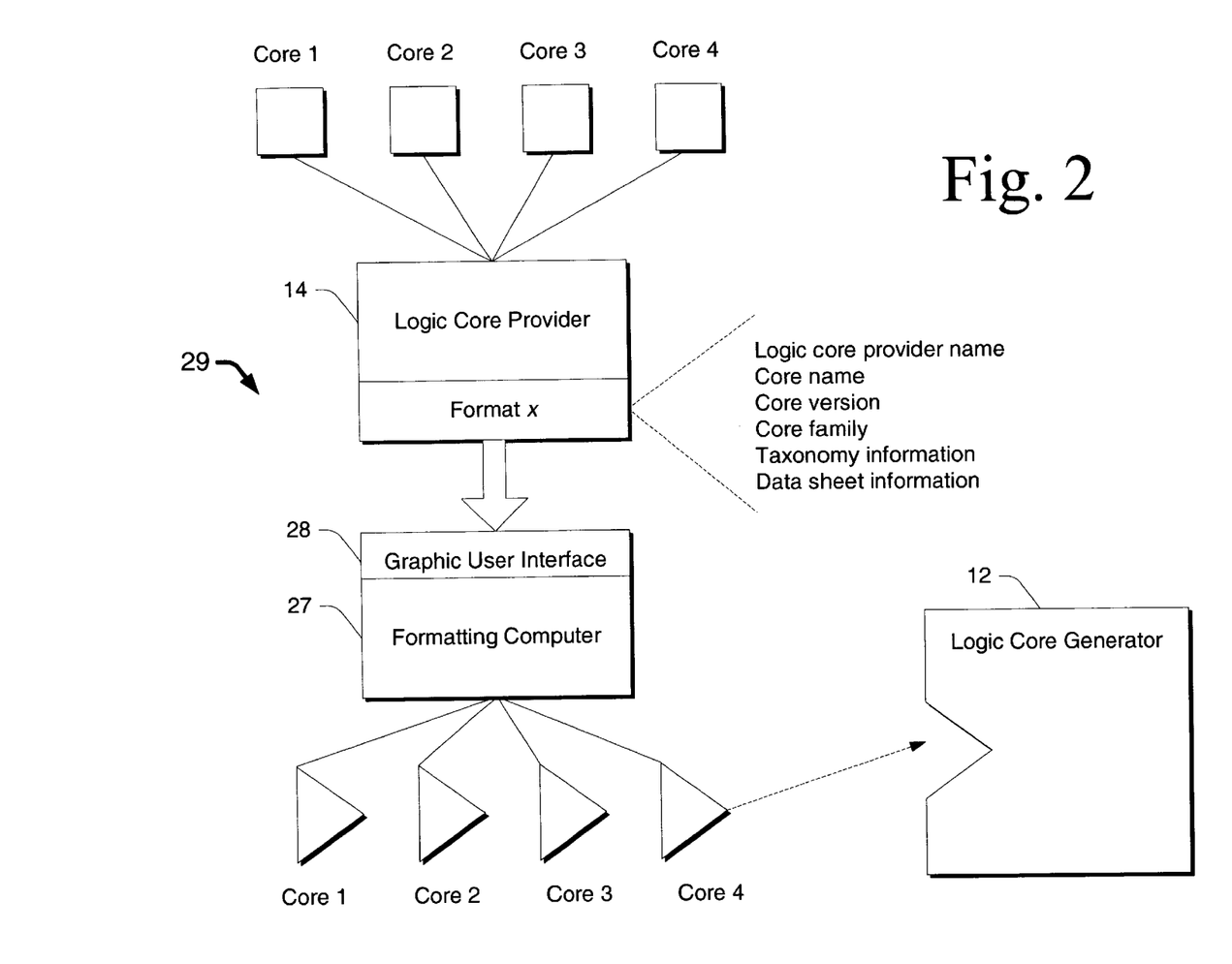
FIG. 2 is a block diagram that illustrates a logic core provision system in accordance with one embodiment.

FIG. 2 shows an exemplary system generally at 29 that is configured to provide logic cores from one or more different logic core providers. Each logic core provider may have multiple logic cores that are desired to be used by logic core generator 12. Each logic core provider has its own logic cores arranged in a different format that is not compatible with and cannot be used by logic core generator 12. System 29 preferably collects various information that pertains to one or more logic cores from the different logic core providers, and then provides the information in a format that can be used by logic core generator 12.

In the illustrated example, a single logic core provider 14 is shown. It is understood that multiple different logic core providers can use the inventive methods and systems. Logic core provider 14 includes a plurality of different logic cores that are designated by squares labeled Core 1, Core 2, Core 3, and Core 4. Each of these logic cores, by virtue of its particular format, cannot be used by logic core generator 12. Diagrammatically, this incompatibility is illustrated by a wedge-shaped interface in logic core generator 12 that is unable to receive the square-shaped logic cores. The particular format may include the following information that may be resident in one or more data files that can be distributed across a number of different provider locations: a logic core provider name, a core name, a core version, a core family, taxonomy information (i.e., where the logic core fits in a particular organizational scheme), data sheet information, and the like.

System 29 includes one or more software modules that collect this information from the logic core providers and then render the information into a form that can be used by the logic core generator 12. In the illustrated embodiment, the one or more software modules are resident on a formatting computer 27 and include or define a graphical user interface 28 that enables a logic core provider to quickly specify the information (e.g., relevant files and their locations) that is needed for its logic cores to be provided in a format that can be used by the logic core generator 12. System 29 then retrieves the information and renders it into an appropriate form. For example, the information can be written to a particular directory structure that is built by system 29. In the illustrated embodiment, this directory structure contains one or more core generator-specific files, e.g., XCD files. These XCD files enable the logic cores to be plugged natively into the logic core generator 12. In the illustrated example, this ability is represented by Cores 1–4 being processed by system 29 into triangular shapes (also designated as Cores 1–4) that are received into the wedge-shaped interface of logic core generator 12.

Exemplary Formatting Computer

Figure 3:
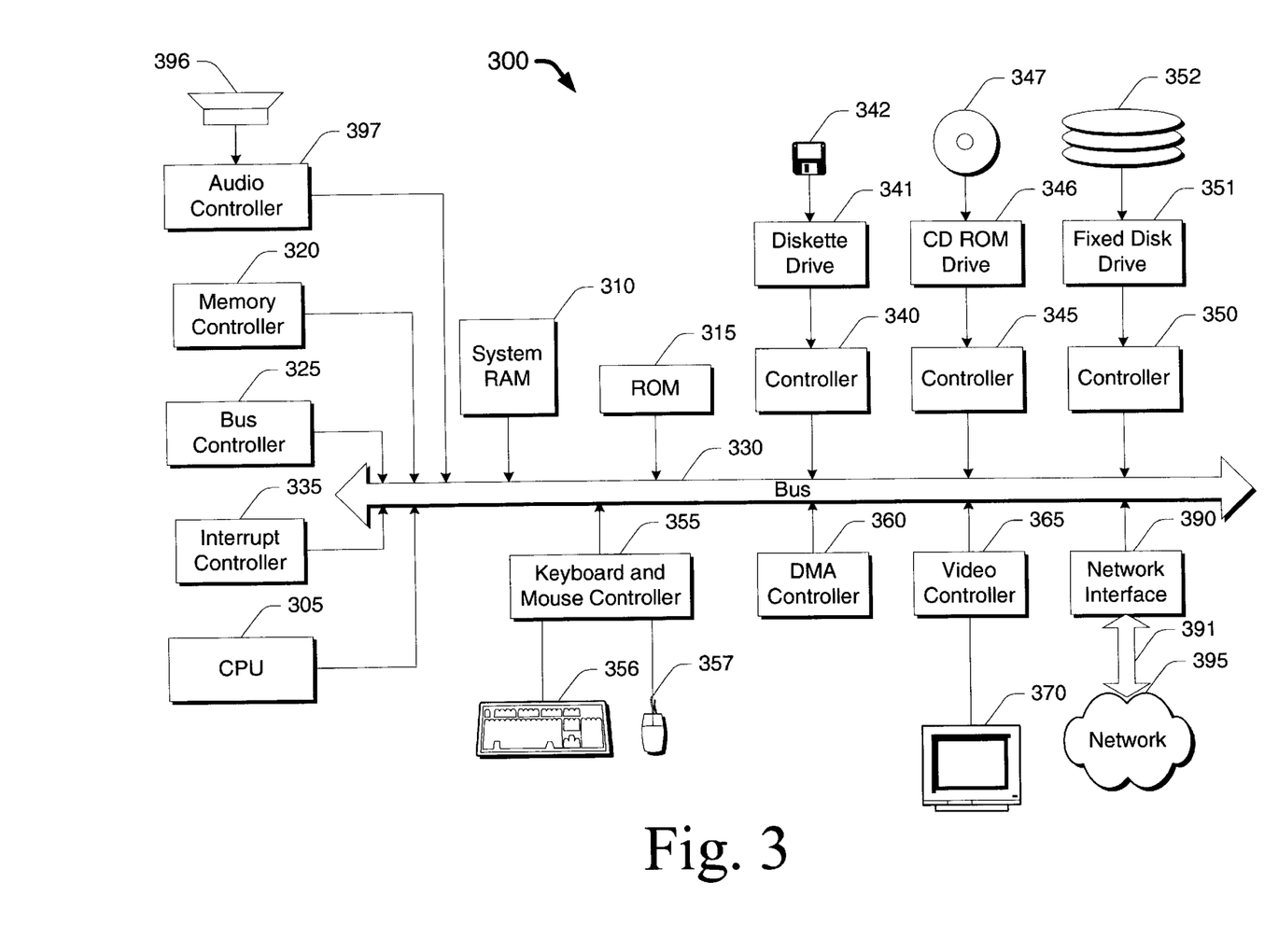
FIG. 3 is a diagram of an exemplary computer system that can be utilized to implement one or more embodiments.

FIG. 3 illustrates an exemplary system architecture for a computer system 300 on which the described formatting computer 27 (FIG. 2) can be implemented. The exemplary computer system of FIG. 3 is for descriptive purposes only. Although the description below may refer to terms commonly used in describing particular computer systems, the description and concepts apply equally to other systems, including systems having architectures dissimilar to FIG. 3.

The computer system 300 includes a central processing unit (CPU) 305 that can include one or more conventional microprocessors, a random access memory (RAM) 310 for temporary storage of data and information, and a read only memory (ROM) 315 for permanent storage of data and information. A memory controller 320 is provided for controlling RAM 310. A bus controller 325 is provided for controlling bus 330, and an interrupt controller 335 is used for receiving and processing various interrupt signals from the other system components. Mass storage can be provided by diskette 342, CD ROM 347 or hard drive 352, to name just a few. Data and software, including software code that implements various of the described embodiments, can be exchanged with computer system 300 via computer-readable media such as diskette 342, CD ROM 347, and hard drive 352. Diskette 342 is insertable into diskette drive 341, which is, in turn, connected to bus 330 by a controller 340. Similarly, CD ROM 347 is insertable into CD ROM drive 346, which is connected to bus 330 by controller 345. Hard disk 352 is part of a fixed disk drive 351 that is connected to bus 330 by controller 350.

User input to computer system 300 can be provided by a number of devices. For example, a keyboard 356 and mouse 357 are connected to bus 330 by controller 355. An audio transducer 396, which may act as both a microphone and a speaker, is connected to bus 330 by audio controller 397, as illustrated. It will be understood by those reasonably skilled in the art that other input devices such as a pen and/or tablet and a microphone for voice input may be connected to computer system 300 through bus 330 and an appropriate controller. DMA controller 360 is provided for performing direct memory access to RAM 310. A visual display is generated by video controller 365 which controls a video or user display 370 such as a monitor. Computer system 300 also includes a network interface 390 that allows the system to be interconnected to a local area network (LAN) or a wide area network (WAN), schematically illustrated by bus 391 and network 395.

Computer system 300 is generally controlled and coordinated by operating system software such as the Windows NT operating system, available from Microsoft Corporation of Redmond, Wash. The operating system controls allocation of system resources and performs tasks such as process scheduling, memory management, and networking and I/O services, among other things. In one embodiment, computer system 300 is utilized to provide a graphical user interface (GUI) that is displayed on display 370. The GUI can be provided through any conventional methods. In the described embodiment, the GUI comprises part of a logic core bundling wizard that is written in Java™. (Java is a trademark of Sun Microsystems, Inc.) Any suitable programming language can, however, be used.

The embodiments described herein include various types of computer-readable storage media when such media contain instructions or programs for implementing the steps described below in conjunction with a microprocessor or other data processor. The invention also includes the computer itself when programmed according to the methods and techniques described below.

Exemplary Methods of Providing Logic Cores

Figure 4:
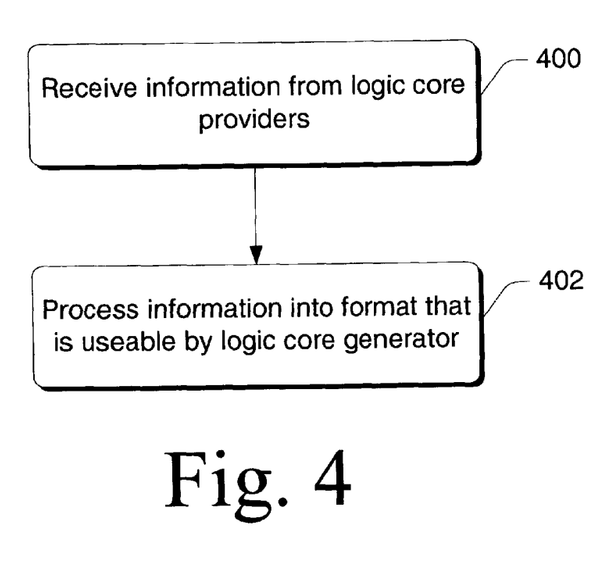
FIG. 4 is a flow diagram that describes steps in a method in accordance with one embodiment.

FIG. 4 shows a flow diagram that describes steps in a method in accordance with one embodiment of the invention. The method can be implemented using any suitable hardware, software, firmware, or combination thereof. In some embodiments, the method is implemented using a system such as that described in connection with FIG. 2. The method advantageously enables multiple different logic core providers to provide information about their particular logic cores so that the information can be bundled into a format that can be used by a particular logic core generator.

In step 400, information is received from one or more logic core providers. The information pertains to one or more logic cores that are available from the logic core provider. In the described embodiment, the information is in a format that cannot be used by a particular logic core generator. Preferably, this information is received directly into a computer. The information can be collected in any suitable way. In step 402, the information is processed with the computer to provide the information in a format that can be used by the logic core generator to generate logic cores.

Figure 5:
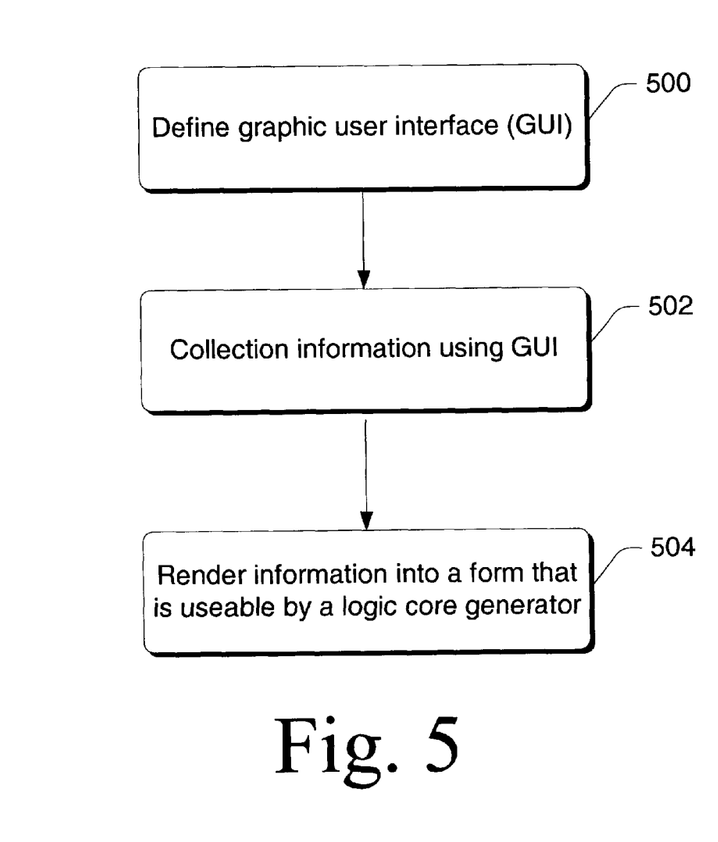
FIG. 5 is a flow diagram that describes steps in a method in accordance with one embodiment.

FIG. 5 is a flow diagram illustrating one method according to the invention for collecting the information from the logic core providers. The method can be implemented using any suitable hardware, software, firmware, or combination thereof. In some embodiments, the method is implemented using a system such as that described in connection with FIG. 2.

In step 500, a graphical user interface (GUI) is defined that is configured to collect the information from a logic core provider. Various types of information can be collected. For example, information concerning the core provider name, core name, core version, data sheet information, and a destination directory can be collected. The GUI application advantageously ensures that all necessary information and in some instances additional desirable information is collected. The GUI application may also take measures to ensure that any files referenced by a user exist and are readable. That is, much of the information that is provided by a user is resident in one or more data files. In order for the information to be properly used, these files should exist in the locations that the user specifies, and they should be readable. Otherwise, the system may not be able to access the information contained in the data files and might not be able to reformat the information in the proper format. In step 502, the information is collected using the GUI. Once all of the information has been collected using the GUI, in step 504 the information is rendered into a form (e.g., a logic core generator-specific file) that is usable by the logic core generator for generating one or more logic cores.

Exemplary Graphical User Interface (GUI)

FIGS. 6–11 show an exemplary graphical user interface (GUI) that can be used in connection with the described embodiments. In some embodiments, the GUI is generated using a computer system such as the one described in connection with FIGS. 2 and 3. It is to be understood, however, that the GUI described below constitutes but one way of collecting information from one or more third party logic core providers. Other methods and structures, e.g., other GUIs, can be utilized to collect the third party information without departing from the spirit and scope of the claimed subject matter.

The described GUI is rendered on a user's or logic core provider's computer display and enables information to be collected which is then automatically processed by a computer, such as formatting computer 27 (FIG. 2), into a form that is useable by a particular logic core generator. The described GUI is advantageously embodied as a software wizard that captures the logic core information from various providers. This information includes, without limitation, company and core information, source files for implementation, simulation information and files, and CAE integration information. The output of the software wizard is a bundled collection of cores that can be distributed over a network and used natively by the particular core generator. A preferred core generator is the Xilinx CORE Generator™ system mentioned above. Through the inventive software wizard, information is collected in an easy, foolproof way. Information that is required can be flagged and browsing capabilities can be extended for files that are to be provided. Additionally, the existence of the files is also checked, taxonomy is enforced, and descriptions can be provided for many of the fields that are described below.

Figure 6:
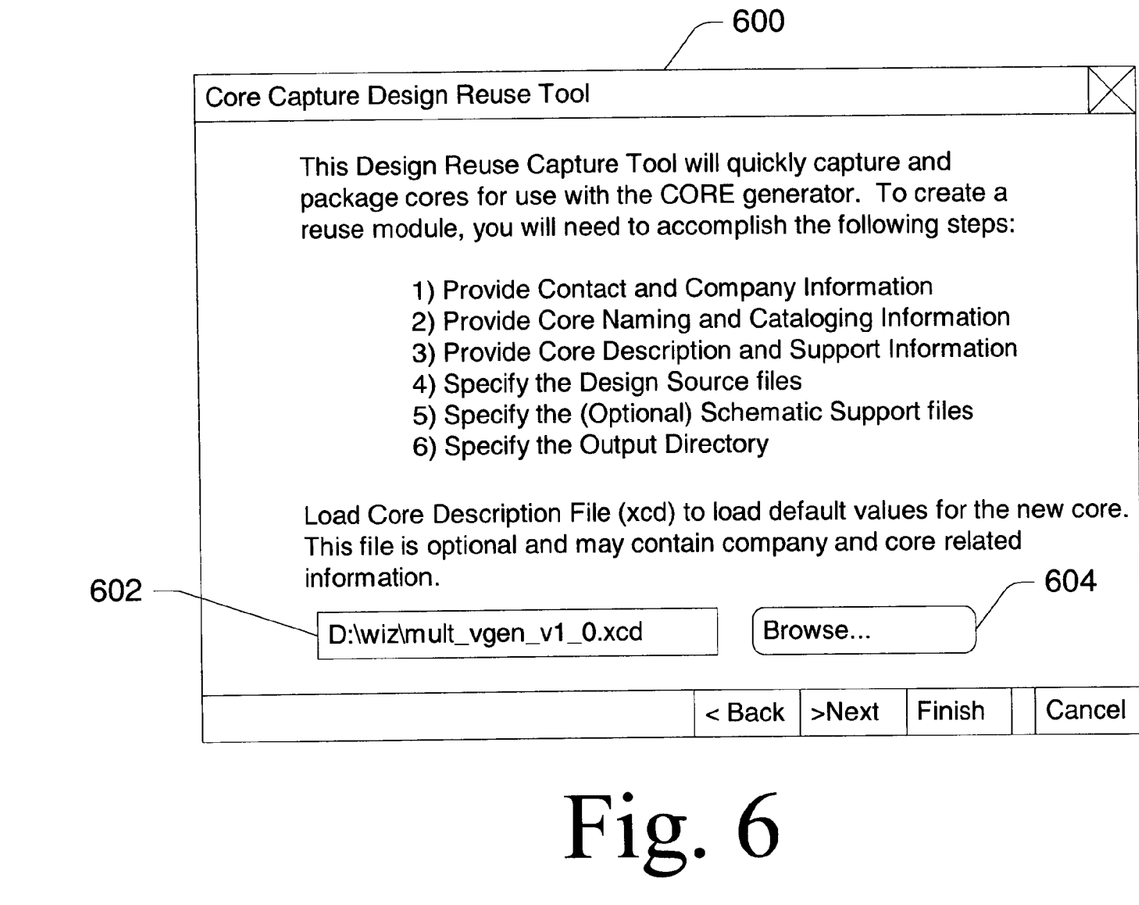
FIG. 6 is an exemplary screen that is provided by a graphical user interface (GUI) in accordance with one embodiment.

FIG. 6 shows an exemplary first screen 600 for a GUI in accordance with the described embodiment. This screen introduces the user to the "Core Capture Design Reuse Tool." Navigation buttons, i.e., "<Back", ">Next", "Finish" and "Cancel" are provided to assist the user in navigating through the information collection process. A field 602 is provided to enable to user to optionally load default values for the new core. A browse button 604 is provided to enable the user to browse through the relevant file directory to find the pertinent description file.

Figure 7:
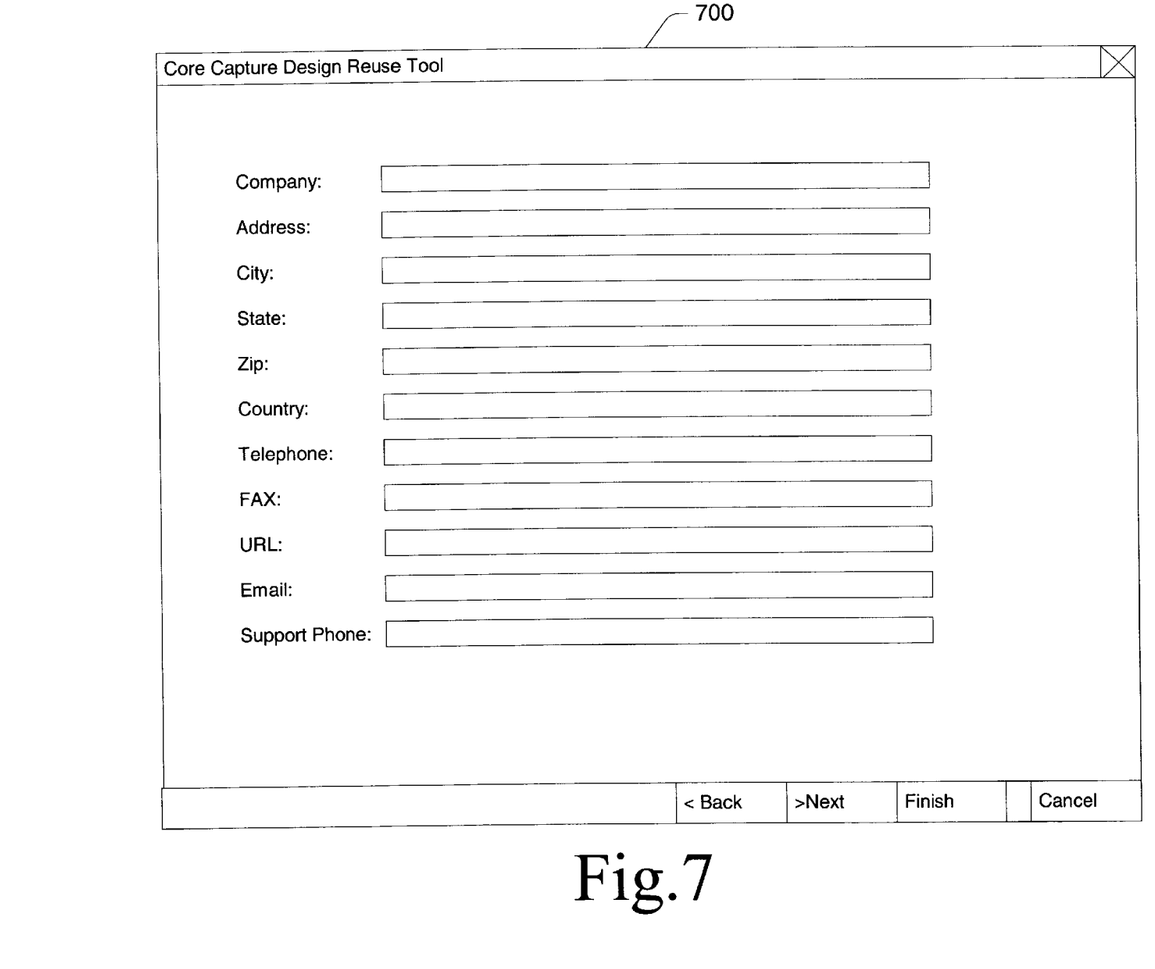
FIG. 7 is an exemplary screen that is provided by a GUI in accordance with one embodiment.

FIG. 7 shows an exemplary screen 700 that is utilized to collect various company information. In the illustrated example, fields are provided for the company name, address, city, state, zip code, and country. In addition, fields are provided for telephone, facsimile (FAX), URL, email, and support phone numbers.

Figure 8:
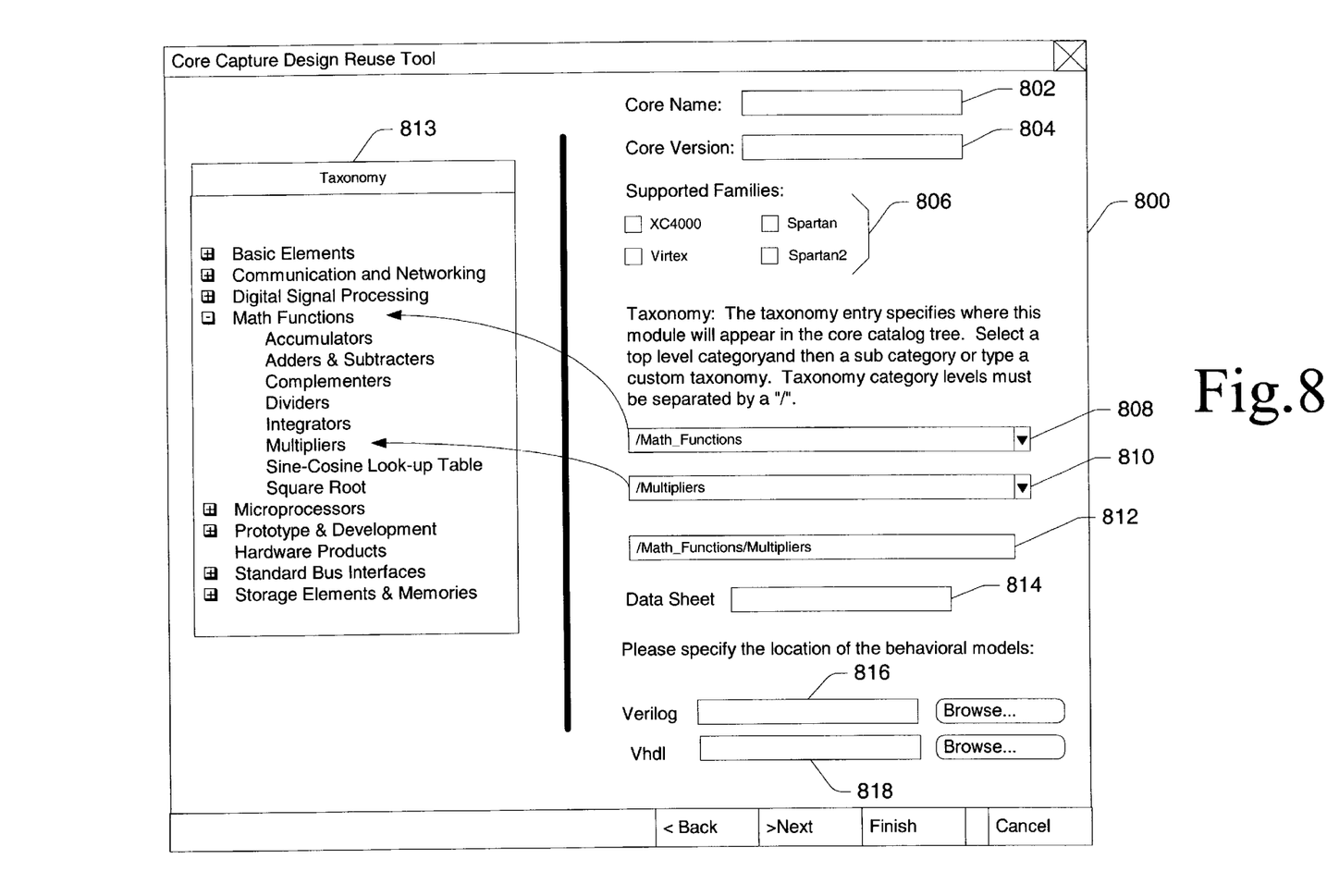
FIG. 8 is an exemplary screen that is provided by a GUI in accordance with one embodiment.

FIG. 8 shows an exemplary screen 800 that is utilized to collect various information that is specific to a logic core of interest. Various fields are provided to collect the information. In the illustrated example, a field 802 is provided for holding a logic core name and a field 804 is provided for holding a logic core version. For example, it is not unlikely for a core to have two or more versions. Fields 806 are provided for holding information associated with families of a logic core that might be supported by the core of interest. In this example, there are four supported product families, the XC4000, Virtex™, Spartan™, and Spartan™2 families of FPGAs (field programmable gate arrays) from Xilinx, Inc.

A desirable aspect of the described embodiment is the use of taxonomy information for a logic core of interest. That is, a user is able through the use of fields 808 and 810 to define the taxonomy for a particular logic core. In the present example, field 808 indicates that the present core is a "math function" core. Field 810 further specifies that the math function is a "multiplier". The taxonomy of the core is shown in field 812 and chart 813 that may be concurrently rendered for a user. Chart 813 describes various other non-exclusive categories into which logic cores can be grouped.

Field 814 is provided and holds information that is associated with data sheet characteristics of the particular core of interest. The data sheet contains typical information such as operating parameters and other associated characteristics that will be appreciated by those of skill in the art.

Fields 816 and 818 are provided and hold information that is associated with one or more behavioral models that are associated with the logic core of interest.

Figure 9:
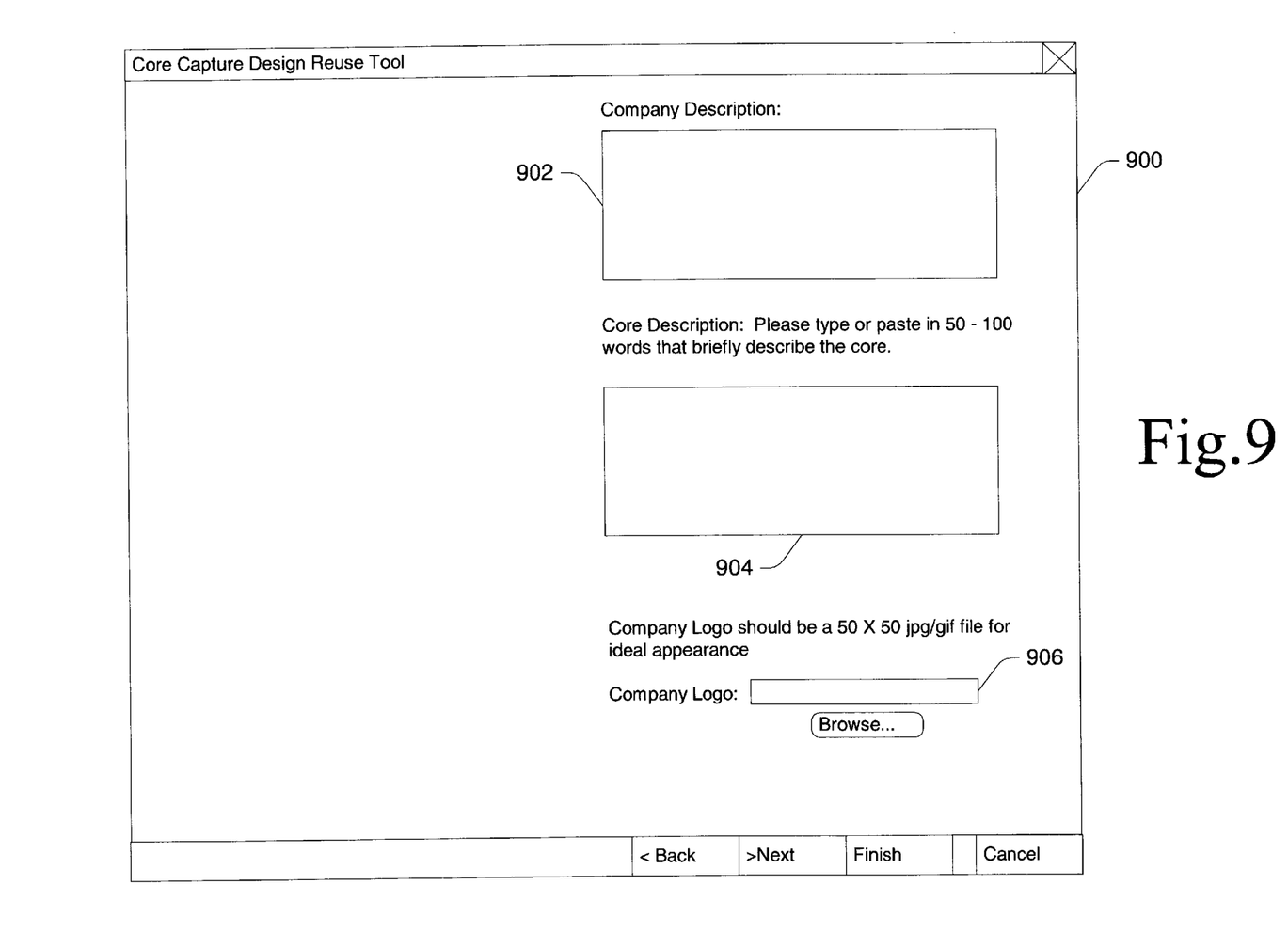
FIG. 9 is an exemplary screen that is provided by a GUI in accordance with one embodiment.

FIG. 9 shows an exemplary screen 900 that is utilized to collect information associated with the company, the core, and possibly a company logo. Field 902 is provided and enables a third party core provider to give a description of its company. Field 904 enables the core provider to provide a description of the core of interest. Field 906 enables a core provider to provide a file that enables a company logo to appear in the resultant presentation that a client will see.

Figure 10:
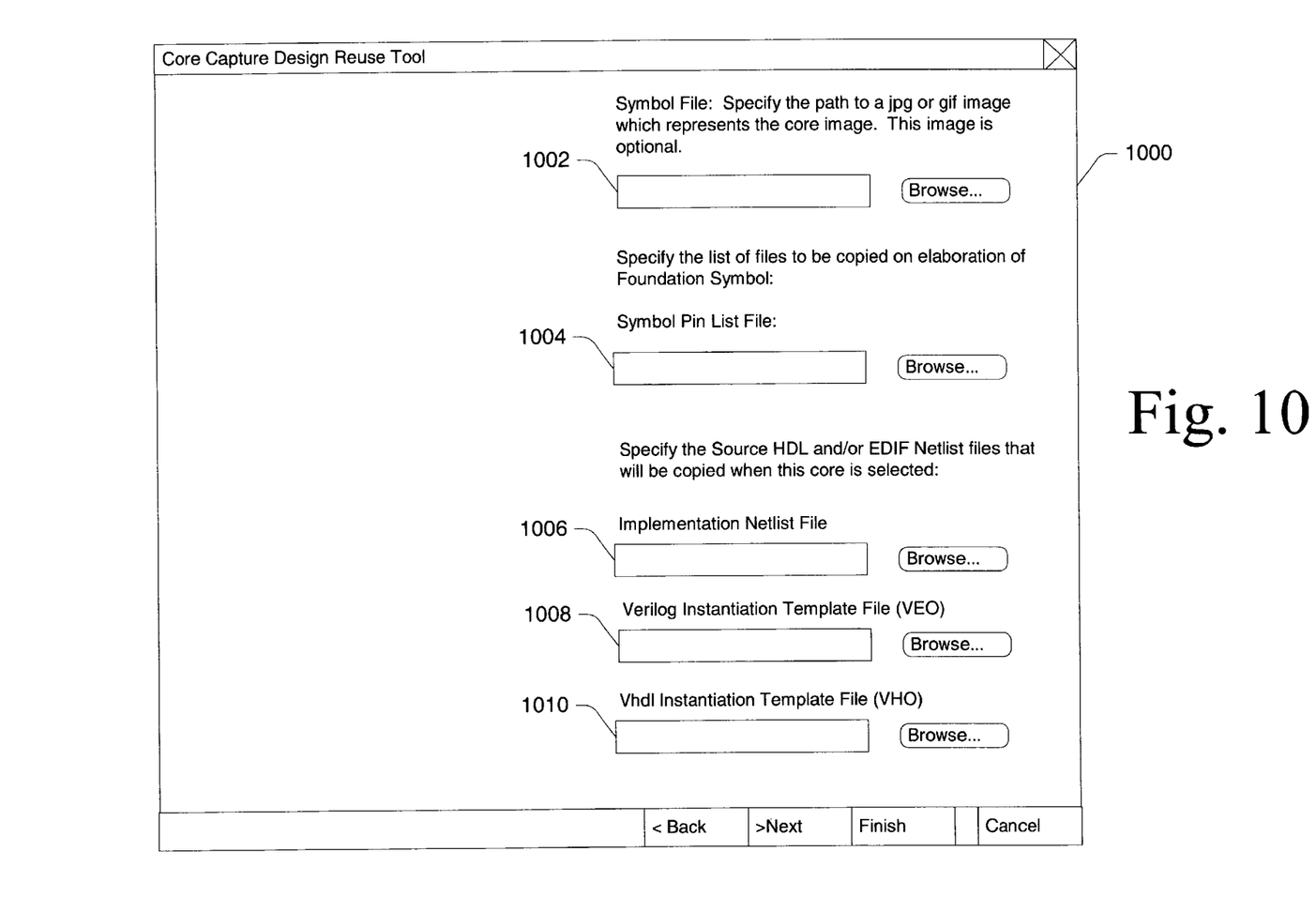
FIG. 10 is an exemplary screen that is provided by a GUI in accordance with one embodiment.

FIG. 10 shows an exemplary screen 1000 that is utilized to collect information associated with various files that a third party core provider should or might want to provide. Field 1002 holds information that is associated with a symbol file that represents the logic core image. Field 1004 holds information that is associated with a symbol pin list file. Field 1006 holds information associated with an implementation netlist file; field 1008 holds information that is associated with a Verilog instantiation template file (VEO); and field 1010 holds information associated with a VHDL instantiation template file (VHO). The information associated with these files is preferably a file path to the pertinent file of interest.

Figure 11:
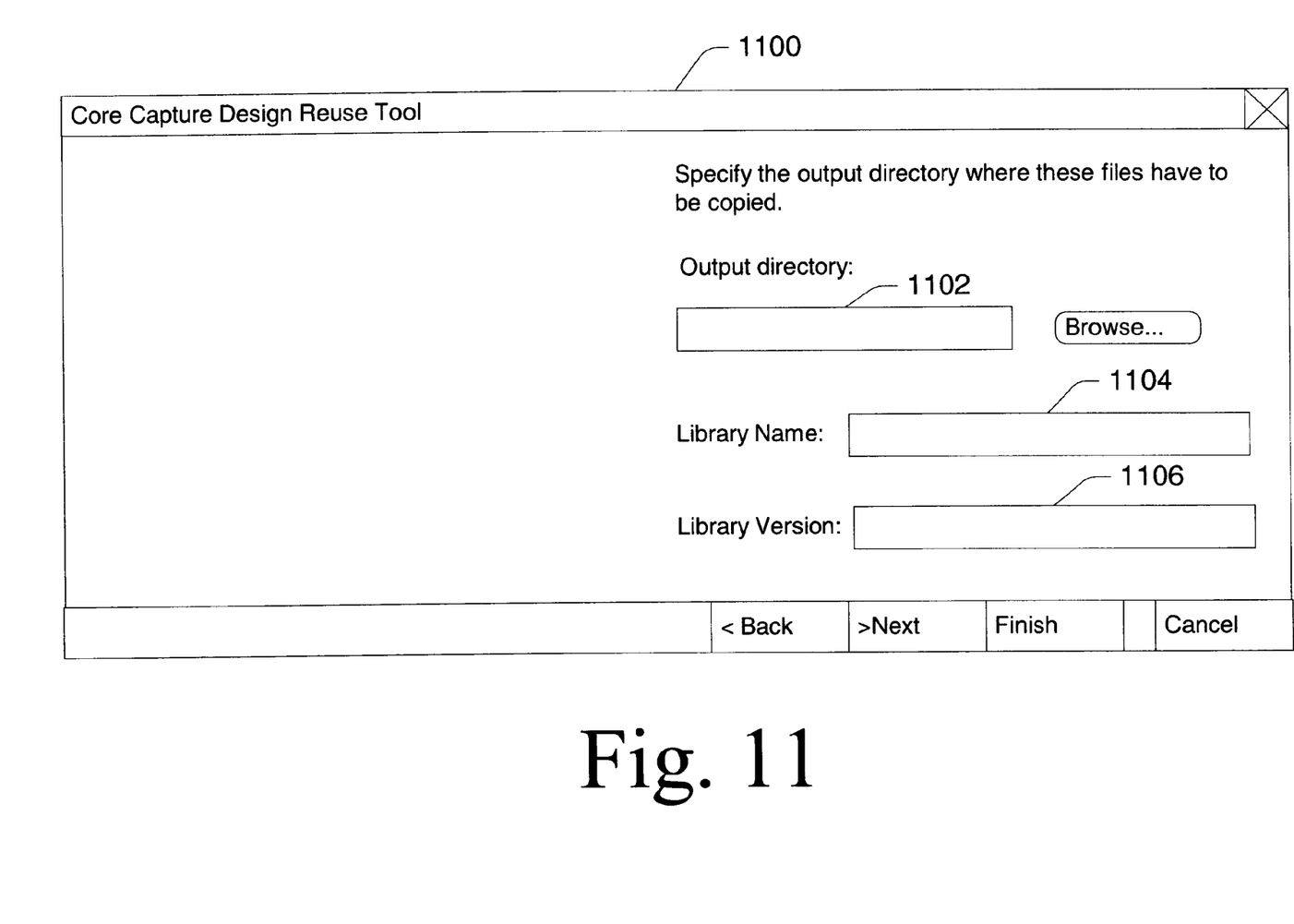
FIG. 11 is an exemplary screen that is provided by a GUI in accordance with one embodiment.

FIG. 11 shows an exemplary screen 1100 that is utilized to collect information associated with an output directory where the files that were specified above will be copied. Field 1102 is provided and contains the output directory specified by the user. Fields 1104 and 1106 are provided and contain a library name and library version, respectively, specified by the user.

Once all of the above information is collected, the information is bundled into a format that can be utilized by the logic core generator of interest. For example, the information can be reorganized into a directory structure that contains one or more XCD files that can be utilized by the logic core generator. Table 1 provides a description and format of an XCD file.

Conclusion

In the embodiments described above, methods and systems are utilized that bundle different diverse logic cores into a standardized format that can be utilized by a particular logic core generator. In the illustrated example, the users or third party core providers provide the relevant core data files (e.g., EDN/NGC, XCD, PDF, XSF, VHO, VEO and the like), along with any desired behavioral models for simulation. The resultant XCD file must be filled out properly in order for the core to be incorporated into the logic core generator. The inventive methods and systems guide the user through a process that ensures the user can enter the needed data in such a manner that the data can be organized for appropriate use. For example, the core data files provided by the user can be installed in a certain defined subdirectory and within a specific directory structure that identifies the core by its name and version. This capability enables third party core providers to package their cores quite easily which, in turn, facilitates reuse of the cores by others.

Although the invention has been described in language specific to structural features and/or methodological steps, it is to be understood that the invention defined in the appended claims is not necessarily limited to the specific features or steps described. Rather, the specific features and steps are disclosed as exemplary forms of implementing the claimed invention.

TABLE 1

| Property | Value | Mandatory? | Used by |
| --- | --- | --- | --- |
| module = | Comb Filter | Yes | GUI |
| version = | 3.5 | Yes | All |
| description = | Level 1 core | No | GUI |
| taxonomy = | /LogiCORE/DSP/Filters | Yes | GUI |

TABLE 1-continued

| Property | Value | Mandatory? | Used by |
|---|---|---|---|
| chipFamily = | x4k_all | Yes | Application, GUI |
| internalModuleName = | combfilt | Yes | User visible core name. GUI |
| spec = | combfilt/spec/ combfiltVHT.aco | Yes | Spec sheets. GUI |
| logo = | Combfilt/logo/ xilinx.logo | Yes | Customizer |
| companyName = | Xilinx Inc | Yes | Contact Info in Customizer |
| address = | 2300, 55th street, Boulder 80301 | Yes | Contact Info in Customizer |
| phone = | 303-xxx-xxxx | Yes | Contact Info in Customizer |
| fax = | 303-xxx-xxxx | Yes | Contact Info in Customizer |
| email = | coregen@xilinx.com | Yes | Contact Info in Customizer |
| webPage = | www.xilinx.com | Yes | Contact Info in Customizer |
| class = | combfilt/lib/ Smitha.class | No | Sim customizer and elaborator |
| verilogSim = | combfilt/simverilog/ combfiltVHT.v | No | Fixed Elaborator |
| vhdlSim = | combfilt/simvhdl/ combfiltVHT.vhd | No | Fixed Elaborator |
| elaborator = | sim | No | elaborator Plug-in |
| customizer = | sim | No | customizer Plug-in |
| verilogSym = | combfilt/verilogSym/ combfiltVSYM.v | No | Fixed Elaborator |
| impNetList = | fixmult/fixmult.edn fixmult/fixmult.edg | No | Fixed Elaborator |
| viewSym = | combfilt/viewSym/ combfiltViewSYM.v | No | Fixed Elaborator |
| foundationSym = | combfilt/foundSym/ combfiltFSYM.v | No | Fixed Elaborator |
| vhdlSym = | combfilt/vhdlSym/ combfiltVhdlSYM.v | No | Fixed Elaborator |
| fixedCustomizerTextFile = | combfilt/spec/ combfilt.tne | No | Fixed Elaborator |
| behaviorMap = | combfilt/vht/ combfiltVHT.fom | No | Sim Elaborator |
| foreign Customization-Exe = | combfilt/exe/ alliance CustWin.exe: WIN combfilt/spec/ allianceCustUnix.exe: UNIX combfilt/spec/ allianceCustHp.exe: HP | No | Foreign Customizer |
| foreignCustomizationArgs = | arg1 arg2 | No | Foreign Customizer |
| foreignElaborationExe = | combfilt/exe/ allianceElaborate Win.exe: WIN combfilt/spec/ alliance-ElaborateUnix.exe: UNIX combfilt/spec/ alliance-ElaborateHp.exe: HP | No | Foreign Elaborator |
| foreignElaborationArgs = | Arg1 arg2 | No | Foreign Elaborator |
| secure_ config | off | protect (default is off) | No | Sim Elaborator |
| secure_ bitstream | off | prohibit (default is off) | No | Sim Elaborator |
| secure_ netlist | off | encrypt | prohibit (default is off) | No | Sim Elaborator |

What is claimed is:

1. A computer-implemented method of providing logic cores for use with a logic core generator, comprising:

receiving, with a computer, information from one or more logic core providers, the information pertaining to one or more logic cores that are available from the logic core providers and being in individual formats that cannot be used by the logic core generator, the information comprising at least one of: core family information, taxonomy information, data sheet information, behavioral model information, core description information, and a destination directory; and processing the information with the computer to provide the information in a format that can be used by the logic core generator to generate logic cores.

2. The computer-implemented method of claim 1, wherein processing the information provides the information in a format that comprises at least one XCD file.

3. The computer-implemented method of claim 1, wherein the one or more logic cores are fixed logic cores.

4. The computer-implemented method of claim 1, wherein the information comprises at least one file.

5. The computer-implemented method of claim 1, wherein the information comprises a logic core provider name.

6. The computer-implemented method of claim 1, wherein the information comprises a logic core name.

7. The computer-implemented method of claim 1, wherein the information comprises at least one core version.

8. The computer-implemented method of claim 1, wherein the information comprises a core family.

9. The computer-implemented method of claim 1, wherein the information comprises taxonomy information.

10. The computer-implemented method of claim 1, wherein the information comprises data sheet information.

11. The computer-implemented method of claim 1, wherein the information comprises at least one destination directory.

12. A computer-implemented method of providing logic cores for use with a logic core generator, comprising:

receiving, with a computer, information from one or more logic core providers, the information pertaining to one or more logic cores that are available from the logic core providers and being in individual formats that cannot be used by the logic core generator; and processing the information with the computer to provide the information in a format that can be used by the logic core generator to generate logic cores, wherein the information comprises at least one file, and wherein processing the information comprises copying the at least one file to a provider-specified location.

13. A computer-implemented method of providing logic cores for use with a logic core generator, comprising:

receiving, with a computer, information from one or more logic core providers, the information pertaining to one or more logic cores that are available from the logic core providers and being in individual formats that cannot be used by the logic core generator; and processing the information with the computer to provide the information in a format that can be used by the logic core generator to generate logic cores, wherein the information comprises at least one file, and wherein processing the information comprises creating a directory structure to hold the processed information.

14. One or more computer-readable media having computer-readable instructions thereon which, when executed by a computer, cause the computer to:
  receive information from one or more logic core providers, the information pertaining to one or more logic cores that are available from the logic core providers and being in individual formats that cannot be used by a particular logic core generator, the information comprising at least one of: core family information, taxonomy information, data sheet information, behavioral model information, core description information, and a destination directory; and
  process the information to provide the information in a format that can be used by the particular logic core generator to generate logic cores.

15. The computer-readable media of claim 14, wherein the instructions cause a graphical user interface (GUI) to be displayed on the computer, the GUI being configured to interface with the one or more logic core providers and collect the information.

16. The computer-readable media of claim 14, wherein the instructions cause the computer to receive one or more files that pertain to the one or more logic cores.

17. A computerized system configured to provide logic cores, comprising:
  one or more processors;
  memory; and
  software code in the memory which, when executed by the one or more processors, causes the one or more processors to:
    receive information from one or more logic core providers, the information pertaining to one or more logic cores that are available from the logic core providers and being in individual formats that cannot be used by a particular logic core generator, the information comprising at least one of: core family information, taxonomy information, data sheet information, behavioral model information, core description information, and a destination directory; and
    process the information to provide the information in a format that can be used by the particular logic core generator to generate logic cores.

18. A computer-implemented method of providing logic cores for use with a logic core generator, comprising:
  defining a graphical user interface (GUI) configured to interface with third party logic core providers and to collect information pertaining to one or more logic cores provided by the third party logic core providers, the information comprising at least one of: core family information, taxonomy information, data sheet information, behavioral model information, core description information, and a destination directory;
  collecting the information from the third party logic core providers using the GUI; and
  rendering the information collected using the GUI into a form useable by the logic core generator for generating one or more logic cores.

19. The computer-implemented method of claim 18, wherein defining the GUI comprises providing a field for holding a logic core provider name.

20. The computer-implemented method of claim 18, wherein defining the GUI comprises providing a field for holding a logic core name.

21. The computer-implemented method of claim 18, wherein defining the GUI comprises providing a field for holding a logic core version.

22. The computer-implemented method of claim 18, wherein defining the GUI comprises providing a field for holding taxonomy information.

23. The computer-implemented method of claim 18, wherein defining the GUI comprises providing a field for holding information associated with a data sheet.

24. The computer-implemented method of claim 18, wherein defining the GUI comprises providing a field for holding a destination directory.

25. The computer-implemented method of claim 18, wherein defining the GUI comprises providing a field for holding information associated with one or more behavioral models.

26. The computer-implemented method of claim 18, wherein rendering the information comprises copying at least one file to a destination directory.

27. The computer-implemented method of claim 18, wherein rendering the information comprises copying at least one file to a destination directory that is specified by a logic core provider.

28. The computer-implemented method of claim 18, wherein the information comprises one or more data files.

29. The computer-implemented method of claim 18, wherein rendering the information comprises processing the information to provide at least one core generator-specific file.

30. The computer-implemented method of claim 29, wherein the at least one core generator-specific file comprises an XCD file.

31. One or more computer-readable media having computer-readable instructions thereon which, when executed by a computer, implement the method of claim 18.

32. A computerized system configured to provide logic cores, comprising:
  one or more processors;
  memory; and
  software code in the memory which, when executed by the one or more processors, causes the one or more processors to:
    define a graphical user interface (GUI) configured to interface with third party logic core providers and to collect information pertaining to one or more logic cores provided by the third party logic core providers, the information comprising at least one of: core family information, taxonomy information, data sheet information, behavioral model information, core description information, and a destination directory;
    collect the information from the third party logic core providers using the GUI; and
    render the information that is collected using the GUI into a form useable by the logic core generator for generating one or more logic cores.

33. The system of claim 32, wherein the software code in the memory causes the one or more processors to define a GUI having at least one of the following fields: a core provider name field, a core name field, a core version field, a taxonomy field, a data sheet field, and a destination directory field.

34. A logic core bundling wizard configured for use in connection with a computer system having one or more processors, the logic core bundling wizard comprising a graphical user interface (GUI) executable on the one or more processors and configured to collect information from one or more third party logic core providers so that the one or more processors can process the information into a form useable by a particular logic core generator, wherein the information comprises at least one of: core family information, taxonomy information, data sheet information, behavioral model information, core description information, and a destination directory.

35. The logic core bundling wizard of claim 34, wherein the information comprises at least one of: a logic core provider name and a logic core version.

36. A logic core bundling wizard configured for use in connection with a computer system having one or more processors, the logic core bundling wizard comprising a graphical user interface (GUI) executable on the one or more processors and configured to collect information from one or more third party logic core providers so that the one or more processors can process the information into a form useable by a particular logic core generator, wherein the information comprises one or more files and their locations.

37. The logic core bundling wizard of claim 36, wherein the one or more files comprise a symbol file.

38. The logic core bundling wizard of claim 36, wherein the one or more files comprise a netlist file.

39. The logic core bundling wizard of claim 36, wherein the one or more files comprise an instantiation template file.

40. The logic core bundling wizard of claim 36, wherein the information comprises an output directory where the one or more files have to be copied.

41. A logic core bundling wizard configured for use in connection with a computer system having one or more processors, the logic core bundling wizard comprising a graphical user interface (GUI) executable on the one or more processors and configured to collect information from one or more third party logic core providers so that the one or more processors can process the information into a form useable by a particular logic core generator, wherein the wizard is configured to verify at least some of the information.

42. The logic core bundling wizard of claim 41, wherein the wizard verifies at least one file location.

43. The logic core bundling wizard of claim 41, wherein the wizard verifies that a file is readable.

44. The logic core bundling wizard of claim 41, wherein the wizard verifies that a destination location exists and is writable.

45. A logic core system, comprising:

a logic core generator;

multiple logic cores from a single logic core provider; and at least one logic core from at least one different logic core provider; and a software module configured to collect information from the at least one different logic core provider and render the information into a form useable by the logic core generator;

wherein all of the logic cores are useable by the logic core generator to provide one or more logic cores, wherein the information comprises one or more file locations containing files that can be copied by the module into a destination location.

46. The logic core system of claim 45, further comprising multiple logic cores from multiple different logic core providers.

47. The logic core system of claim 47, wherein the software module defines a graphical user interface that is used to collect the information.

48. The logic core system of claim 47, wherein the information comprises at least one of: a core provider name, a core name, a core version, taxonomy information, and a core description.

49. A computerized system configured to provide logic cores, comprising:

a user display;

one or more processors;

memory; and software code in the memory that, when executed by the one or more processors, causes the processors to present a graphical user interface (GUI) on the user display through which a third party logic core provider can enter information about one or more of the logic cores that they provide and have the information automatically processed by the one or more processors into a form useable by a particular logic core generator, wherein the software code in the memory causes the one or more processors to define a GUI having at least one of the following fields: a core family information field, a taxonomy information field, a data sheet information field, a behavioral model information field, a core description information field, and a destination directory field.

* * * * *